(12) United States Patent
Chen et al.

(10) Patent No.: US 10,048,879 B2
(45) Date of Patent: *Aug. 14, 2018

(54) NONVOLATILE MEMORY RECOVERY AFTER POWER FAILURE DURING WRITE OPERATIONS OR ERASE OPERATIONS

(71) Applicant: Seagate Technology LLC, Cupertino, CA (US)

(72) Inventors: Zhengang Chen, San Jose, CA (US); Earl T. Cohen, Oakland, CA (US); Alex G. Tang, Cupertino, CA (US)

(73) Assignee: SEAGATE TECHNOLOGY LLC, Cupertino, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/298,636

(22) Filed: Oct. 20, 2016

(65) Prior Publication Data

US 2017/0038985 A1    Feb. 9, 2017

Related U.S. Application Data

(63) Continuation of application No. 13/854,263, filed on Apr. 1, 2013, now Pat. No. 9,478,271.

(Continued)

(51) Int. Cl.
*G06F 3/06* (2006.01)
*G11C 7/24* (2006.01)
(Continued)

(52) U.S. Cl.
CPC .......... *G06F 3/0619* (2013.01); *G06F 3/0647* (2013.01); *G06F 3/0679* (2013.01);
(Continued)

(58) Field of Classification Search
CPC ....................................................... G11C 7/24
See application file for complete search history.

(56) References Cited

U.S. PATENT DOCUMENTS 4,815,028 A * 3/1989 Saitoh ................. G06F 11/1438
714/20
5,337,275 A * 8/1994 Garner ................. G06F 3/0601
365/185.11

(Continued)

FOREIGN PATENT DOCUMENTS

CN       101124555 B  * 5/2012    ......... G06F 12/0246
CN       102736985 A  * 10/2012
(Continued)

OTHER PUBLICATIONS

Tseng, Hung-Wei et al., "Understanding the Impact of Power Loss on Flash Memory", DAC 2011, Jun. 5-10, 2011, 6 pages.

*Primary Examiner* — Anthan Tran
*Assistant Examiner* — Mushfique Siddique
(74) *Attorney, Agent, or Firm* — Christopher P. Maiorana, PC

(57) ABSTRACT

A method for recovery after a power failure. The method generally includes a step of searching at least some of a plurality of pages of a memory to find a first erased page in response to an unsafe power down. A step may move stored data located between a particular word line in the memory that contains the first erased page and a previous word line that is at least two word lines before the particular word line. Another step may write new data starting in a subsequent word line that is the at least two word lines after the particular word line that contains the first erased page.

20 Claims, 7 Drawing Sheets

Related U.S. Application Data

(60) Provisional application No. 61/781,744, filed on Mar. 14, 2013.

(51) Int. Cl.
- *G11C 8/20* (2006.01)
- *G11C 11/56* (2006.01)
- *G11C 16/10* (2006.01)
- *G11C 16/22* (2006.01)
- *G11C 16/26* (2006.01)

(52) U.S. Cl.
CPC ............. *G11C 7/24* (2013.01); *G11C 8/20* (2013.01); *G11C 11/5628* (2013.01); *G11C 16/10* (2013.01); *G11C 16/225* (2013.01); *G11C 16/26* (2013.01)

(56) References Cited

U.S. PATENT DOCUMENTS

| | | | | |
|---|---|---|---|---|
| 5,404,485 A * | 4/1995 | Ban | G06F 3/0601 | 711/202 |
| 5,544,312 A * | 8/1996 | Hasbun | G06F 1/30 | 714/14 |
| 5,742,934 A * | 4/1998 | Shinohara | G06F 3/0601 | 711/103 |
| 5,745,418 A * | 4/1998 | Ma | G06F 3/0616 | 365/185.33 |
| 5,799,168 A * | 8/1998 | Ban | G06F 12/0246 | 711/103 |
| 5,867,641 A * | 2/1999 | Jenett | G06F 12/0246 | 711/103 |
| 5,974,546 A * | 10/1999 | Anderson | G06F 11/2284 | 713/2 |
| 5,987,563 A * | 11/1999 | Itoh | G06F 3/0601 | 711/1 |
| 6,014,724 A * | 1/2000 | Jenett | G06F 3/0607 | 711/103 |
| 6,170,066 B1 * | 1/2001 | See | G06F 11/1441 | 713/340 |
| 6,230,285 B1 * | 5/2001 | Sadowsky | G06F 11/1417 | 714/14 |
| 6,421,792 B1 * | 7/2002 | Cromer | G06F 11/1417 | 713/2 |
| 6,493,807 B1 * | 12/2002 | Martwick | G11C 16/102 | 711/103 |
| 6,621,746 B1 * | 9/2003 | Aasheim | G06F 12/0246 | 365/185.29 |
| 6,675,278 B1 * | 1/2004 | Chowdhary | G06F 12/0238 | 711/103 |
| 6,725,321 B1 * | 4/2004 | Sinclair | G06F 3/0619 | 365/185.29 |
| 6,839,823 B1 * | 1/2005 | See | G06F 12/023 | 711/103 |
| 6,901,499 B2 * | 5/2005 | Aasheim | G06F 12/0246 | 711/205 |
| 6,938,116 B2 * | 8/2005 | Kim | G06F 12/0246 | 711/103 |
| 6,988,175 B2 * | 1/2006 | Lasser | G11C 11/5628 | 365/228 |
| 7,076,599 B2 * | 7/2006 | Aasheim | G06F 3/0619 | 711/103 |
| 7,107,480 B1 | 9/2006 | Moshayedi et al. | | 714/2 |
| 7,178,061 B2 * | 2/2007 | Aasheim | G06F 3/0619 | 714/24 |
| 7,350,105 B2 | 3/2008 | Aasheim et al. | | 714/24 |
| 7,516,267 B2 * | 4/2009 | Coulson | G06F 12/0246 | 711/103 |
| 7,552,148 B2 * | 6/2009 | Liu | G06F 11/1435 | |
| 7,657,697 B2 * | 2/2010 | Oshima | G06F 3/0619 | 711/103 |
| 7,719,890 B2 * | 5/2010 | Gorobets | G06F 11/1441 | 365/185.04 |
| 7,769,945 B2 * | 8/2010 | Lasser | G06F 12/0246 | 711/103 |
| 7,873,885 B1 * | 1/2011 | Shin | G11C 29/56 | 365/185.33 |
| 7,882,375 B2 * | 2/2011 | Yoon | G11C 16/30 | 713/300 |
| 7,890,461 B2 * | 2/2011 | Oeda | G06F 11/1471 | 707/612 |
| 7,904,635 B2 * | 3/2011 | Deng | G06F 11/1441 | 711/103 |
| 7,941,692 B2 * | 5/2011 | Royer | G06F 11/1064 | 711/103 |
| 8,041,991 B2 * | 10/2011 | McKean | G06F 11/1662 | 714/6.32 |
| 8,051,257 B2 * | 11/2011 | Gorobets | G06F 11/1072 | 711/156 |
| 8,103,819 B2 * | 1/2012 | Suzuki | G06F 12/0246 | 711/103 |
| 8,135,904 B2 * | 3/2012 | Lasser | G06F 12/0246 | 711/103 |
| 8,151,034 B2 * | 4/2012 | Gorobets | G06F 11/1441 | 365/131 |
| 8,156,392 B2 * | 4/2012 | Flynn | G06F 11/006 | 365/185.01 |
| 8,194,340 B1 * | 6/2012 | Boyle | G11B 5/09 | 360/48 |
| 8,261,005 B2 * | 9/2012 | Flynn | G06F 3/0613 | 711/103 |
| 8,266,102 B2 | 9/2012 | Akirav et al. | | 707/613 |
| 8,307,241 B2 * | 11/2012 | Avila | G06F 12/0802 | 714/6.2 |
| 8,316,257 B2 | 11/2012 | Royer et al. | | 714/6.1 |
| 8,327,064 B2 * | 12/2012 | Kitagawa | G06F 12/0246 | 711/103 |
| 8,327,224 B2 * | 12/2012 | Larsen | G06F 11/108 | 714/763 |
| 8,335,885 B2 * | 12/2012 | Lin | G06F 3/0614 | 711/102 |
| 8,339,855 B2 * | 12/2012 | Lasser | G11C 11/5628 | 365/185.09 |
| 8,341,340 B2 * | 12/2012 | Rub | G06F 12/0246 | 711/103 |
| 8,472,280 B2 * | 6/2013 | Li | G11C 11/5628 | 365/189.14 |
| 8,473,923 B2 * | 6/2013 | Lin | G06F 11/1441 | 711/103 |
| 8,533,562 B2 * | 9/2013 | Mee | G06F 11/1441 | 711/103 |
| 8,572,311 B1 * | 10/2013 | Shalvi | G06F 11/14 | 711/103 |
| 8,725,935 B2 * | 5/2014 | Huang | G11C 7/1042 | 711/103 |
| 8,732,391 B2 * | 5/2014 | Shepard | G11C 5/005 | 711/103 |
| 8,775,901 B2 * | 7/2014 | Sharon | G06F 11/1048 | 714/763 |
| 8,788,880 B1 * | 7/2014 | Gosla | G11B 20/10527 | 714/16 |
| 8,838,925 B2 * | 9/2014 | Rankl | G06F 21/79 | 365/185.03 |
| 8,843,693 B2 * | 9/2014 | Hsu | G11C 7/1012 | 711/103 |
| 9,218,851 B2 * | 12/2015 | Shlick | G11C 5/005 | |
| 9,256,523 B2 * | 2/2016 | Takizawa | G11C 7/1009 | |
| 9,275,747 B2 * | 3/2016 | Baumann | G11C 16/22 | |
| 9,406,372 B2 * | 8/2016 | Candelier | G11C 7/24 | |
| 9,478,271 B2 * | 10/2016 | Chen | G11C 7/24 | |
| 2002/0099904 A1 * | 7/2002 | Conley | G06F 12/0246 | 711/103 |
| 2003/0182588 A1 * | 9/2003 | Dodd | G06F 1/3225 | 713/300 |
| 2005/0055531 A1 * | 3/2005 | Asami | G06F 12/0246 | 711/203 |
| 2006/0013048 A1 * | 1/2006 | Kim | G11C 29/76 | 365/200 |

(56) References Cited

U.S. PATENT DOCUMENTS

| | | | |
|---|---|---|---|
| 2006/0126394 A1* | 6/2006 | Li | G11C 11/5628 365/185.22 |
| 2006/0259718 A1* | 11/2006 | Paley | G06F 11/1072 711/159 |
| 2007/0083697 A1* | 4/2007 | Birrell | G06F 12/0246 711/103 |
| 2007/0174355 A1* | 7/2007 | Woo | G06F 17/30368 |
| 2008/0219053 A1* | 9/2008 | Kim | G11C 16/0483 365/185.11 |
| 2009/0067241 A1* | 3/2009 | Gorobets | G06F 11/1441 365/185.04 |
| 2009/0070521 A1* | 3/2009 | Gorobets | G06F 11/1441 711/103 |
| 2009/0070529 A1* | 3/2009 | Mee | G06F 11/1441 711/114 |
| 2009/0070748 A1* | 3/2009 | Lin | G06F 11/1441 717/130 |
| 2009/0172466 A1* | 7/2009 | Royer | G06F 11/1064 714/6.12 |
| 2009/0287893 A1* | 11/2009 | Cheng | G06F 11/141 711/159 |
| 2009/0327580 A1* | 12/2009 | Hamilton | G06F 12/0246 711/103 |
| 2009/0327837 A1* | 12/2009 | Royer | G06F 12/0246 714/763 |
| 2010/0023800 A1* | 1/2010 | Harari | G06F 11/1068 714/2 |
| 2010/0070735 A1 | 3/2010 | Chen et al. | 711/206 |
| 2010/0106753 A1* | 4/2010 | Prabhakaran | G06F 17/30371 707/818 |
| 2010/0125751 A1* | 5/2010 | McKean | G06F 11/1662 714/5.1 |
| 2010/0169543 A1* | 7/2010 | Edgington | G06F 12/0246 711/103 |
| 2010/0211737 A1* | 8/2010 | Flynn | G06F 3/0616 711/114 |
| 2010/0306583 A1* | 12/2010 | Kim | G11C 29/82 714/6.13 |
| 2011/0035548 A1* | 2/2011 | Kimmel | G06F 3/061 711/114 |
| 2011/0040932 A1* | 2/2011 | Frost | G06F 12/0246 711/103 |
| 2011/0041005 A1* | 2/2011 | Selinger | G06F 11/10 714/719 |
| 2011/0041039 A1* | 2/2011 | Harari | G06F 11/1068 714/773 |
| 2011/0066793 A1* | 3/2011 | Burd | G06F 11/1028 711/103 |
| 2011/0119462 A1* | 5/2011 | Leach | G06F 12/0246 711/166 |
| 2011/0138113 A1* | 6/2011 | Leach | G06F 11/1008 711/103 |
| 2011/0138222 A1* | 6/2011 | Haines | G06F 11/1048 714/6.12 |
| 2011/0161784 A1* | 6/2011 | Selinger | G06F 11/1068 714/768 |
| 2011/0258368 A1* | 10/2011 | Kim | G06F 12/0246 711/103 |
| 2011/0302477 A1* | 12/2011 | Goss | G06F 11/1068 714/773 |
| 2012/0084492 A1* | 4/2012 | Stenfort | G06F 3/0605 711/103 |
| 2012/0117309 A1* | 5/2012 | Schuette | G06F 3/0616 711/103 |
| 2012/0151253 A1* | 6/2012 | Horn | G06F 12/0804 714/6.22 |
| 2012/0192032 A1* | 7/2012 | Iwasaki | G06F 11/1048 714/758 |
| 2012/0233523 A1* | 9/2012 | Krishnamoorthy | G06F 11/1068 714/758 |
| 2012/0254503 A1* | 10/2012 | Chiu | G06F 3/0619 711/103 |
| 2012/0260149 A1* | 10/2012 | Chang | G06F 11/1068 714/773 |
| 2012/0284574 A1* | 11/2012 | Avila | G11C 16/28 714/704 |
| 2012/0284587 A1* | 11/2012 | Yu | G06F 3/0608 714/773 |
| 2012/0290779 A1* | 11/2012 | Eleftheriou | G06F 3/0616 711/103 |
| 2012/0317458 A1* | 12/2012 | So | G06F 11/1044 714/763 |
| 2013/0019057 A1* | 1/2013 | Stephens | G06F 11/108 711/103 |
| 2013/0031429 A1* | 1/2013 | Sharon | G06F 11/1048 714/718 |
| 2013/0151892 A1* | 6/2013 | Huang | G06F 12/0246 714/14 |
| 2013/0173845 A1* | 7/2013 | Aslam | G06F 12/0871 711/103 |
| 2013/0205066 A1* | 8/2013 | Dusija | G06F 12/0246 711/103 |
| 2013/0246892 A1* | 9/2013 | Au | G06F 11/1008 714/773 |
| 2013/0275835 A1* | 10/2013 | Aswadhati | G06F 11/1068 714/773 |
| 2013/0297986 A1* | 11/2013 | Cohen | H03M 13/1102 714/763 |
| 2014/0129765 A1* | 5/2014 | Cho | G06F 11/1441 711/105 |
| 2014/0223231 A1* | 8/2014 | Mangold | G11C 16/16 714/22 |
| 2014/0258587 A1* | 9/2014 | Baryudin | G06F 12/0246 711/102 |
| 2014/0258755 A1* | 9/2014 | Stenfort | G06F 1/30 713/323 |
| 2014/0359346 A1* | 12/2014 | Chen | G06F 11/1402 714/6.11 |
| 2015/0089325 A1* | 3/2015 | Chandrasekhar | G06F 11/1072 714/766 |
| 2015/0113237 A1* | 4/2015 | Kim | G11C 8/06 711/162 |
| 2016/0062884 A1* | 3/2016 | Kim | G06F 12/0246 711/103 |
| 2016/0179625 A1* | 6/2016 | Hong | G06F 12/0246 711/103 |
| 2016/0268000 A1* | 9/2016 | Thompson | G11C 16/30 |

FOREIGN PATENT DOCUMENTS

| | | | | |
|---|---|---|---|---|
| CN | 102760087 A | * | 10/2012 | G06F 11/1068 |
| CN | 103718162 A | * | 4/2014 | G06F 11/106 |
| WO | WO 2006107651 A1 | * | 10/2006 | G11C 11/5628 |
| WO | WO 2012151131 A1 | * | 11/2012 | G11C 16/28 |
| WO | WO 2014088682 A1 | * | 6/2014 | H03M 13/05 |

\* cited by examiner

NONVOLATILE MEMORY RECOVERY AFTER POWER FAILURE DURING WRITE OPERATIONS OR ERASE OPERATIONS

This application relates to U.S. Ser. No. 13/854,263, filed Apr. 1, 2013, now U.S. Pat. No. 9,478,271, which relates to U.S. Provisional Application No. 61/781,744, filed Mar. 14, 2013, each of which are hereby incorporated by reference in their entirety.

FIELD OF THE INVENTION

The invention relates to nonvolatile memory generally and, more particularly, to a method and/or apparatus for implementing a nonvolatile memory data recovery after a power failure.

BACKGROUND

Data is written to a conventional nonvolatile memory based solid-state drive by programming erased blocks. The blocks are erased in the background and made available to a program operation, or are erased on-demand when the programming operation is initiated. As a nonvolatile media, Flash memory holds the data when power is off. The data programmed before the power is switched off can still be read out from the Flash memory after the power is switched back on. However, when the power is unexpectedly cut off during the program operation or the erase operation, the data integrity of the solid-state drive can be in danger. For example, the data being written may be unrecoverable. Furthermore, since the solid-state drives use a flash translation layer to manage a mapping between logical sectors and physical locations in one or more nonvolatile memory devices, a power failure can render the map incoherent and potentially corrupt a much larger portion of the drive.

SUMMARY

The invention concerns a method for recovery after a power failure. The method generally includes a step of searching at least some of a plurality of pages of a memory to find a first erased page in response to an unsafe power down. A step may move stored data located between a particular word line in the memory that contains the first erased page and a previous word line that is at least two word lines before the particular word line. Another step may write new data starting in a subsequent word line that is the at least two word lines after the particular word line that contains the first erased page.

BRIEF DESCRIPTION OF THE FIGURES

Embodiments of the invention will be apparent from the following detailed description and the appended claims and drawings in which:

DETAILED DESCRIPTION OF THE EMBODIMENTS

Figure 1:
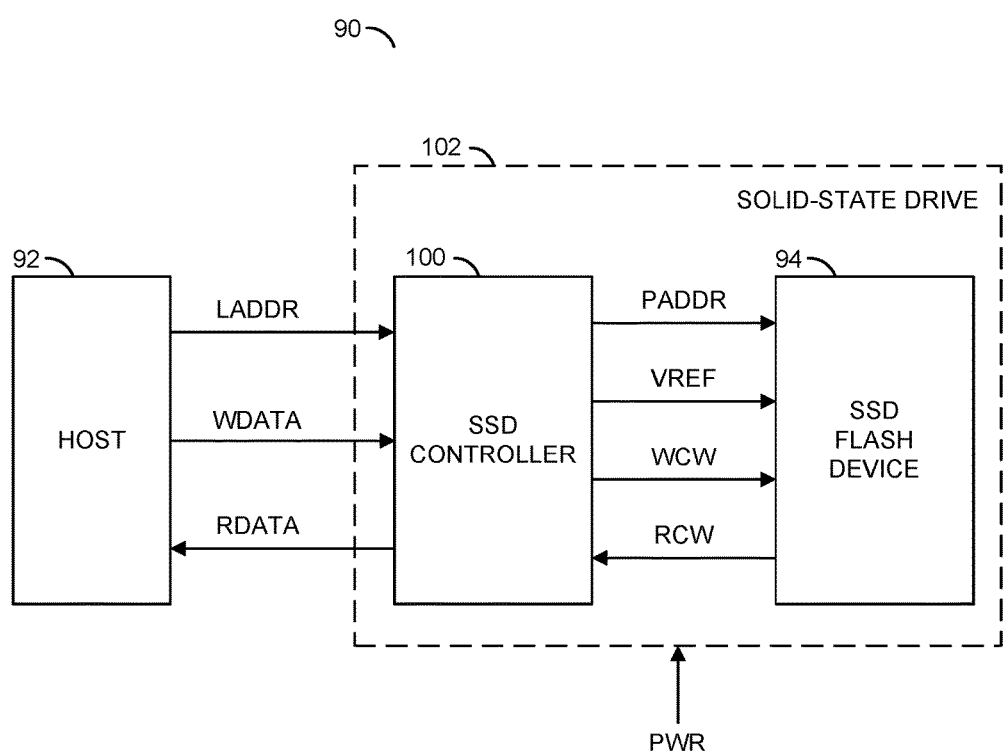
FIG. 1 is a block diagram of an apparatus.

Embodiments of the invention include providing a nonvolatile memory data recovery after a power failure that may (i) provide for data recovery even without external capacitor support, (ii) avoid erasing partially programmed blocks during recovery, (iii) harden recovered data, (iv) pad pages of a block in which programming stopped to condition for programming of subsequent pages of the block, (v) repair a map in a flash transition layer and/or (vi) be implemented in one or more integrated circuits.

Embodiments of the invention generally provide a power failure recovery technique based on multi-bits per cell type nonvolatile (e.g., Flash) memories even without external capacitor support. Unreliable pages are identified by detecting an initial erased page in a block. Rather than erasing the entire block, a portion of a partially programmed block is padded with nonuser data. New user data is subsequently written in the block after the padded area.

A power failure is generally defined as an unplanned or unexpected loss of power to a solid-state drive. Examples of a power failure include a sudden power loss, or a forced shutdown by the user. In a clean power down, the solid-state drive has an advanced warning of the removal of the power. Therefore, the solid-state drive can take active steps to prevent data loss between the warning and the actual loss of power.

A common type of problem caused by a power failure is that any page in the process of being written may be lost. Another type of problem occurs in multi-bit per cell type nonvolatile memories where a power failure while writing an "upper" (e.g., non-least significant bit) page may corrupt less-significant bits stored in the same cells, where the less significant bits correspond to previously successfully-written pages.

When the power is restored, a data recovery procedure is performed to recover data, harden the recovered data and repair a map in the flash transition layer. For data recovery, the procedure attempts to recover as much data as practical. Some to all of the recovered data may subsequently be hardened because the recovered data may be vulnerable due to consequences of the previous power failure and to a possible subsequent power failure. For nonvolatile memory, "harden" generally means rewriting the data from a vulnerable physical location to another, less-vulnerable physical location. Repair of the map in the flash transition layer prepares the drive for normal use.

Power failures during programming can cause one or more issues in nonvolatile memories. For example, already written data in lower pages can be corrupted, detecting a physical location where the programming (of a sequence of pages) stopped is often difficult, and pages may appear to be partially programmed. In multi-level cell (e.g., MLC) type nonvolatile memory, a power failure during upper page programming may corrupt the already written data in the corresponding lower page. The corruption is called "lower page corruption". The lower page corruption problem also occurs in triple-level cell (e.g., TLC) type nonvolatile having a lower bit, a middle bit, and an upper bit in each cell. Depending on when the power failure happens during the program operation, a page may appear to be erased or fully programmed or any state in between after the power is restored. The condition of the page creates difficulties in the recovery procedure for detecting a physical location where the programming stopped when the power failure happened. Furthermore, a page being programmed when the power fails is unreliable, regardless of whether the read-back data appears to be "partially programmed" or not. Appearing to be "partially programmed" means that the page is easily detected (for instance, by running through an error correction code decoder) as corrupted. Therefore, a reliability of a page cannot be fully determined by estimating how many raw bit errors are detected in that page. For example, the page may be correctable but may be more vulnerable than if successfully and fully programmed.

Power failures during an erase operation are handled by the recovery procedure because no user data is lost and existing data is not corrupted. A flash transition layer with a well-defined coherency policy supports the recovery operation.

Referring to FIG. 1, a block diagram of an example implementation of an apparatus 90 is shown. The apparatus (or circuit or device or integrated circuit) 90 implements a computer having a nonvolatile memory circuit. The apparatus 90 generally comprises a block (or circuit) 92, a block (or circuit) 94 and a block (or circuit) 100. The circuits 94 and 100 form a drive (or device) 102. The circuits 92 to 102 may represent modules and/or blocks that may be implemented as hardware, software, a combination of hardware and software, or other implementations.

A signal (e.g., LADDR) is generated by the circuit 92 and received by the circuit 100. The signal LADDR implements an address signal used to access data. A signal (e.g., PADDR) is generated by the circuit 100 and received by the circuit 94. The signal PADDR implements an address signal used to access data in the circuit 94. A signal (e.g., VREF) is shown generated by the circuit 100 and presented to the circuit 94. The signal VREF specifies one or more reference voltages used by the circuit 94 to read data. A signal WDATA is shown generated by the circuit 92 and presented to the circuit 94 through the circuit 100. The signal WDATA generally conveys write data transferred to the circuit 100. A signal (e.g., WCW) is shown generated by the circuit 100 and transferred to the circuit 94. The signal WCW carries error correction coded (e.g., ECC) write codewords written into the circuit 94. A signal (e.g., RCW) is shown generated by the circuit 94 and received by the circuit 100. The signal RCW carries error correction coded codewords read from the circuit 94. A signal (e.g., RDATA) is shown generated by the circuit 100 and presented to the circuit 92. The signal RDATA carries error corrected versions of the data in the signal RCW. A signal (e.g., PWR) is shown being received by the circuit 102.

The circuit 92 is shown implementing a host circuit. The circuit 92 is generally operational to read and write data to and from the circuit 94 via the circuit 100. When reading or writing, the circuit 92 may place an address value in the signal LADDR to identify which set of data is to be written or to be read from the circuit 94. The write data may be presented in the signal WDATA. The read data requested by the circuit 92 may be received via the signal RDATA. The signal LADDR generally spans a logical address range of the circuit 102. The signal LADDR can address individual data units, such as SATA (e.g., serial-ATA) sectors.

The circuit 94 is shown implementing a nonvolatile memory circuit (or device). According to various embodiments, the circuit 94 comprises one or more: nonvolatile semiconductor devices, such as NAND Flash devices, phase change memory (e.g., PCM) devices, or resistive RAM (e.g., ReRAM) devices; portions of a solid-state drive having one or more nonvolatile devices; and any other volatile or nonvolatile storage media. The circuit 94 is generally operational to store data in a nonvolatile condition. When data is read from the circuit 94, the circuit 94 accesses a set of data (e.g., multiple bits) identified by the address (e.g., physical address) in the signal PADDR. The signal PADDR generally spans a physical address range of the circuit 94.

Data within the circuit 94 is generally organized in a hierarchy of units. An R-block is a combination of blocks (e.g., a block from each nonvolatile memory die in the circuit 94) that can be combined to form a redundant array of silicon independent elements, similar to a redundant array of independent disks for magnetic media. The nonvolatile memory locations within the blocks are written in a striped fashion. In some embodiments, organizing a plurality of blocks in R-blocks reduces an overhead of block management. A block is a smallest quantum of erasing. A page is a smallest quantum of writing. A read unit (or codeword or Epage or ECC-page) is a smallest quantum of reading and error correction. Each block includes an integer number of pages. Each page includes an integral number of read units.

An exhibited threshold voltage of each memory cell within the accessed set is compared with the reference voltage specified in the signal VREF. For each memory cell where the reference voltage is above the threshold voltage, one or more logical values are sensed. For each memory cell where the reference voltage is below the threshold voltage, one or more different logical values are sensed.

In some embodiments, the circuit 94 may be implemented as a single-level cell (e.g., SLC) type circuit. A single-level cell type circuit generally stores a single bit per memory cell (e.g., a logical 0 or 1). In other embodiments, the circuit 94 may be implemented as a multi-level cell type circuit. A multi-level cell type circuit is capable of storing multiple (e.g., two) bits per memory cell (e.g., logical 00, 01, 10 or 11). In still other embodiments, the circuit 94 may implement a triple-level cell type circuit. A triple-level cell circuit stores multiple (e.g., three) bits per memory cell (e.g., a logical 000, 001, 010, 011, 100, 101, 110 or 111).

In various embodiments, one or more types of nonvolatile storage devices may be used to implement the circuit 94. Such nonvolatile devices include, but are not limited to, SLC NAND Flash memory, MLC NAND Flash memory, NOR Flash memory, Flash memory using polysilicon or silicon nitride technology-based charge storage cells, two-dimensional or three-dimensional technology-based nonvolatile memory, ferromagnetic memory, phase-change memory, racetrack memory, resistive random access memory, magnetic random access memory and similar types of memory devices and/or storage media.

The circuit 100 is shown implementing a controller circuit. The circuit 100 is generally operational to control reading to and writing from the circuit 94. The circuit 100 comprises one or more integrated circuits (or chips or die) implementing a controller used for controlling one or more solid-state drives (e.g., SSD), embedded storage, or other suitable control applications.

Figure 2:
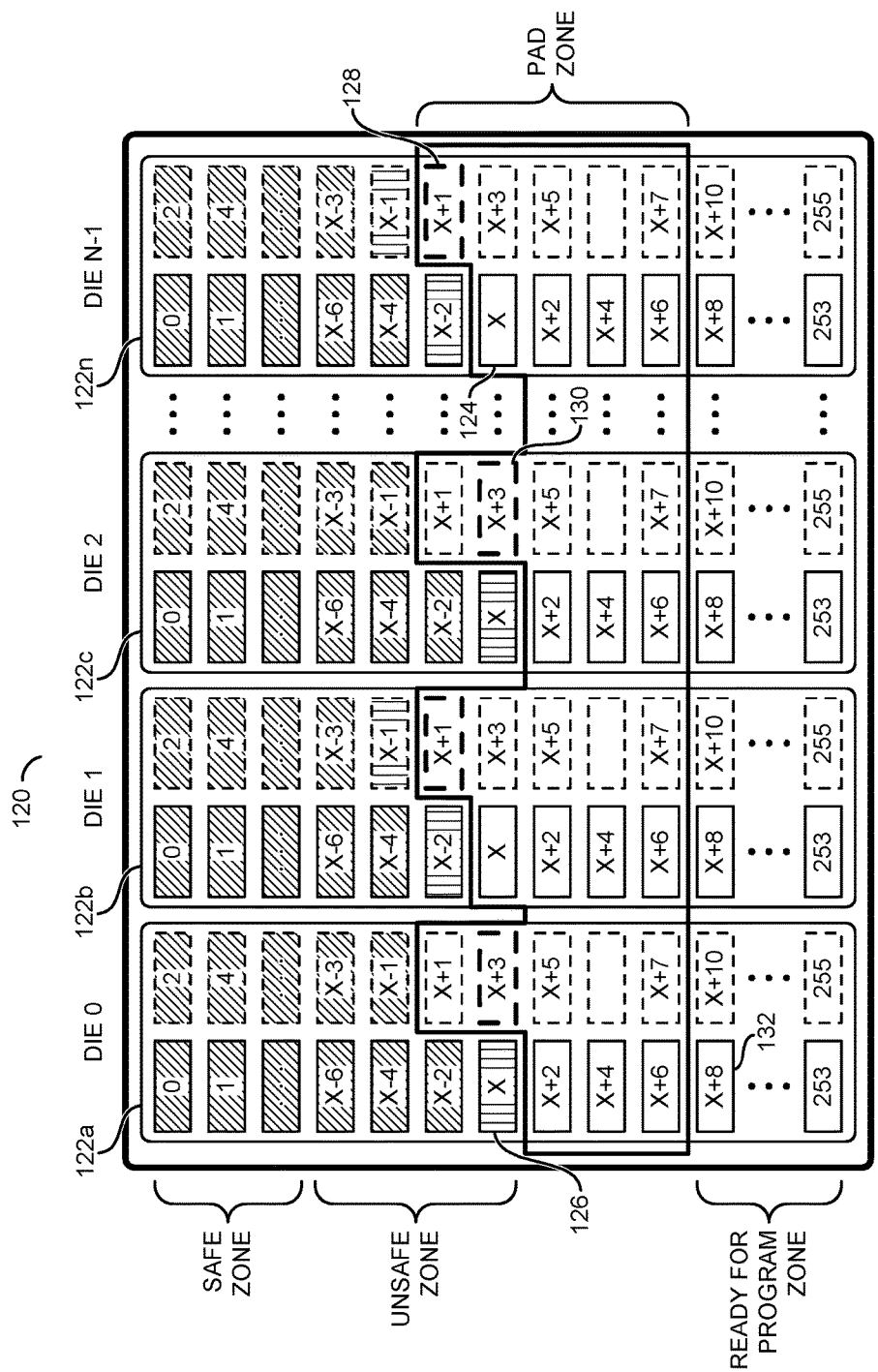
FIG. 2 is a diagram of example partition of an R-block during a recovery.

Referring to FIG. 2, a diagram of an example partition of an R-block 120 during recovery is shown. The R-block 120 is formed from a set of blocks 122a-122n, one block per respective die 0 to die N–1 within the circuit 94. The descriptions that follow are for the multi-level cell type nonvolatile memory, with some extensions to triple-level cell (and larger numbers of bits per cell) pointed out. In the example, each rectangle represents an individual page (e.g., an upper page or a lower page). The rectangles with solid borders are lower pages. The rectangles with dashed borders are upper pages. Shading within the rectangles represents the state (e.g., programmed, partially programmed or unprogrammed) of the pages. Diagonal shading represents programmed pages. Vertical shading represents possible partially programmed pages. No shading (e.g., white) represents unprogrammed (or erased) pages.

All cells in a word line store bits from two pages of data. A lower page contains bits from the lower bits stored in all cells. An upper page contains bits from the upper bits stored in all cells. The lower page and the upper page are programmed separately: lower page first and upper page later. The same technique extends to nonvolatile memories with more bits per cell, such as triple-level cells. For example, a multi-level cell block may have 256 pages, each page being 8,192 bytes. Half of the pages are lower pages and the other half are upper pages. The programming within a block follows a certain order to minimize read errors by controlling inter-cell interference (e.g., ICI) during programming. For example, the programming of the pages in a block follows the order: page 0, 1, 2, 3, ..., 254, 255, where (for example, and except for boundary cases at the edges of a block) page i and page i+6 are the respective lower and upper pages stored in a same set of cells.

In some embodiments, circuit 102 organizes multiple blocks from multiple dies into an R-block. Multiple R-pages are defined within an R-block. An R-page comprises pages with the same page number from all blocks. For example, in an R-block with N (e.g., 64) blocks, one from each of N dies, page 1 from block 0, page 1 from block 1, ..., and page 1 from block N–1 (e.g., 63) form an R-page. The R-page comprising page 1 from each block is generally referred to as R-page 1. The programming in an R-block follows the order: R-page 0, R-page 1, R-page 255 (corresponding to the specified programming order of pages within a block). Within an R-page and/or between consecutive R-pages, the programming of multiple pages may happen in serial or in parallel, and generally follows a determined order of programming for the die.

In the example, a page 124 (e.g., lower page X) in the odd-numbered dies (e.g., die 1, die 3, ..., die N–1) is an initial lower page in the block detected as erased. A page 126 (e.g., lower page X) in the even-numbered dies (e.g., die 0, die 2, ..., die N–2) is the other page in the same R-page as 124 and is detected as possibly partially programmed (e.g., non-erased). A page 128 (e.g., upper page X+1) in the odd-numbered dies is a "no write" page. Programming page X+1 may corrupt data that is possibly partially programmed in lower page X–2 of the odd-numbered dies. The page X–2 in the even-numbered dies contain programmed data and so the corresponding pages X+1 are not considered "no write" pages. A page 130 (e.g., upper page X+3) in the even-numbered dies is also shown as a "no write" page. Programming page X+3 may corrupt data that is possibly partially programmed in lower page X of the even-numbered dies. The page X in the odd-numbered dies is unprogrammed and so the corresponding pages X+3 are not considered "no write" pages.

In various embodiments, writing of data is in a first-in-first-out like (streaming) fashion, where the data initially fills a page, followed by a number of pages to fill an R-page, followed by a number of R-pages to fill an R-block, and finally a number of R-blocks. In further embodiments, multiple such streams may be in progress in different R-blocks at the same time. For example, a circuit 102 may have a "hot" stream with newly written data, a "cold" stream with recycled data, and a "map" stream with the flash transition layer data. Each of the streams is separately written in the first-in-first-out like fashion into a current "head" R-block for that stream. While the data recovery method as described is based on the R-block unit, the recovery method could also be applied at a block level of granularity.

Figure 3:
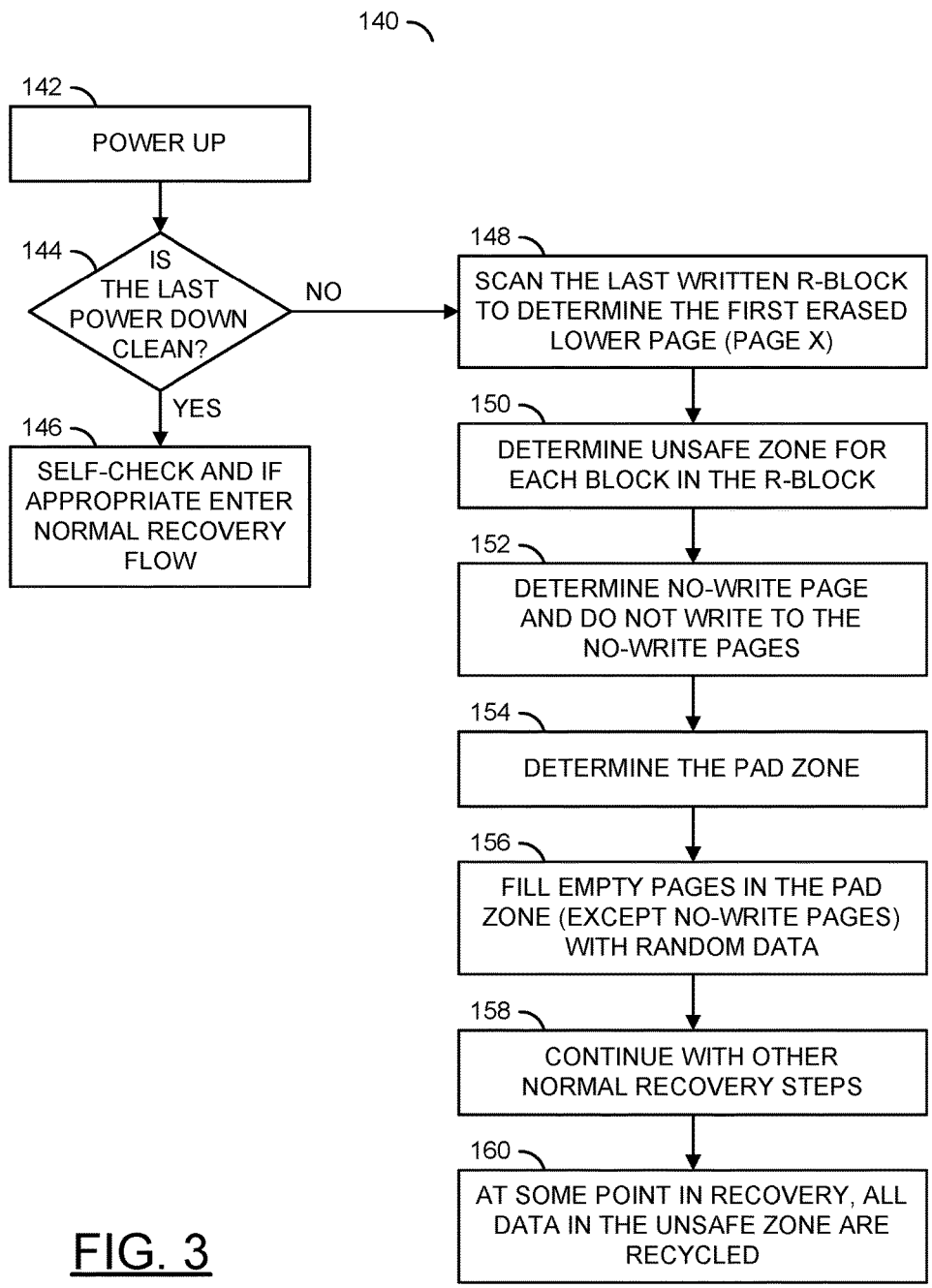
FIG. 3 is a flow diagram of a power failure recovery method in accordance with an embodiment of the invention.

Referring to FIG. 3, a flow diagram of an example implementation of a power failure recovery method 140 is shown in accordance with an embodiment of the invention. The method (or process) 140 is implemented by the circuits 94 and 100. The method 140 generally comprises a step (or state) 142, a step (or state) 144, a step (or state) 146, a step (or state) 148, a step (or state) 150, a step (or state) 152, a step (or state) 154, a step (or state) 156, a step (or state) 158 and a step (or state) 160. The steps 142 to 160 may represent modules and/or blocks that may be implemented as hardware, software, a combination of hardware and software, or other implementations. The sequence of the steps is shown as a representative example. Other step orders may be implemented to meet the criteria of a particular application.

Consider a power failure to the circuit 102 while programming was in progress in an embodiment where a single R-block (or R-page) is being programmed at a time. After the power is restored in the step 142, the circuit 100 decides in the step 144 regarding data recovery from power failure in programming. An initial decision is to determine if the last (previous) power down was a power failure rather than a clean power down. If the previous power down was a power failure, the circuit 100 also determines if a possible programming operation was in progress when the power failure happened. Furthermore, if a programming operation was in progress, the circuit 100 determines which page(s)/R-page(s)/R-blocks were being programmed when the power failure happened.

Distinguishing between a clean power down and a power failure is achieved by programming a clean power down flag, such as a log message, as meta data to the circuit 94 every time power is shut down properly. When the power is restored, the circuit 100 can read the flag to tell whether the last power down was clean or not. If a clean power down was flagged, the circuit 100 generally performs a self-check in the step 146 and enters a normal recovery flow if appropriate. If a clean power down was not flagged, the circuit 100 starts a recovery procedure in the step 148.

The R-blocks are programmed in a streaming manner and certain self-journaling metadata (e.g., a timestamp or sequence number) stored in each written R-block that can be read out to identify the last R-block being programmed. In some embodiments, the recovery procedure could erase the entire R-block that was being programmed during the power failure. However, erasing the entire R-block incurs extra program/erase cycles on many blocks, and potentially loses successfully-programmed data. Therefore, in other embodiments the circuit 100 attempts to detect (as accurately as possible) the R-page(s) that were being programmed during the power failure, and subsequently run recovery procedures on certain R-pages rather than the entire R-block. Note that an R-page comprises multiple pages that can be programmed in parallel or in serial.

A power failure during the programming operation can make the page being programmed appear to be erased, fully programmed or "partially programmed". Accurate detection of the program-failed page by reading the data in the page is not always feasible. Therefore, the last written R-block 120 is scanned in the step 148 to find the first erased lower page in each block (e.g., FIG. 2, odd-numbered dies, page X 124). The detection approximately identifies where the power failure happened and from where to take further steps.

Either the first discovered erased page, or some page before the first discovered erased page, may be (or may be treated as) a last program-failed page.

Detecting whether a page is erased is straightforward since erased pages contain all logical ones for each bit. In various embodiments, a number of logical zero's in the page are counted and a check is performed to determine whether the count exceeds a threshold. In some embodiments, circuit 100 uses a controller-based scrambler to randomize the data to be written. Therefore, detecting erased lower pages compared with programmed pages is possible. Once the first erased (lower) page in each block is detected, the recovery procedure knows roughly where the power failure happened.

In various embodiments, the method 140 can also be applied if the circuit 102 allows multiple R-blocks (or R-pages) to be programmed at the same time. For example, the method 140 is applied separately to each R-block at the head of each stream of R-blocks that was being written at the time of the power failure. An additional complexity is encountered due to multiple R-blocks (or R-pages) being programmed at the same time. In particular, pages within an R-page are not programmed in a defined order because the die containing some of the pages are busy programming pages in other R-blocks. Due to the lack of order, finding a sequence of erased and programmed (or partially-programmed) pages in a stream may not be possible.

After the power has been restored, the R-block 120 that suffered the power failure is partitioned. After the first erased page in each block 122a-122n within the R-block 120 is detected in the step 148, and given knowledge of the page programming order (e.g., the map from page number to word lines), the circuit 100 determines approximately where the previously written data is located and where the new programming should start. In some embodiments, the last possibly-written page is found to ensure that despite dynamic differences in programming order, the point at which programming stopped is determined. For example, the last possibly-written page is a non-erased page followed only by erased pages for at least one R-page. In such embodiments, the first-erased (lower) page is the first (lower) page after the last possibly-written page. According to the power failure characteristics of nonvolatile memory, the recovery procedure partitions the R-block 120 into multiple (e.g., four) zones: a safe zone (e.g., pages already written and unaffected by the power failure), an unsafe zone (e.g., pages possibly written and affected by the power failure), a pad zone (e.g., pages that should not be used for new user data subsequent to the power failure, but which may be programmed to condition other pages for further programming); and a ready for program zone (e.g., pages where programming of new user data can resume).

Data stored in the unsafe zone (e.g., page X–6 to page X) may not be as reliable as data stored in other physical locations due to the power failure during programming. The pages in the unsafe zone are not considered reliable for the following reasons. Some pages (e.g., die 0, page X) may have suffered the power failure during programming. If an upper page suffered the power failure, the corresponding lower page may be subject to lower page corruption. If a page suffered the power failure during programming, some neighboring pages that are already programmed may exhibit different threshold voltage (e.g., Vt) distribution due to abnormal inter-cell interference (e.g., ICI) effects from the program-failed page, thus making reading data from such pages unreliable. The pages in the unsafe zone do not have expected inter-cell interference effects from following pages, since the programming had stopped. Further, programming the following pages is not advisable as (i) some of the following pages may have been partially programmed already and (ii) the unsafe pages are already less reliable. Adding the expected inter-cell interference effects during a program operation of the following pages may improve or hurt the unsafe pages.

As far as the circuit 100 can identify unreliable pages, (e.g., pages in the unsafe zone), the identified unreliable data is hardened by reading portions of the data that are correctable out and re-writing the data to another physical location. Therefore, possibly unreliable pages are identified in the step 150 as part of the unsafe zone. In some embodiments, serialization criteria mandate that writes are completed in an order, and only an initial portion of the unsafe zone that is contiguous to the safe zone and contains no uncorrectable data is hardened. For example, the hardening stops, in some embodiments, at the first uncorrectable page in the unsafe zone, and even if later pages in the unsafe zone are correctable, the later pages are not hardened.

The following rules used in the recovery procedure are all based on the detected first erased page in a block (e.g., FIG. 2, die N–1, page X 124). The default programming order is a natural order, meaning 0, 1, 2, . . . , k–2 and k–1, if a block has k pages. A first rule is that within the same block as page X, page X is considered unreliable. Some embodiments may treat page X as reliable and the page before page X as unreliable.

A second rule is that within the same block as page X, D word lines prior to page X are considered unreliable. The D word lines may not be sequential. A value of D is based on the correspondence between page numbers and word lines, as well as the range of inter-cell interference effects. The D preceding word lines do not always mean page numbers X–2D to X–1. For example in the die N–1 in FIG. 2 and with D=3, consider that both page X–1 and page X–2 may be unreliable and word line [X–6, X–3] may suffer abnormal inter-cell interference. The D unreliable word lines preceding page X are thus the pages: X–6, X–4, X–3, X–2, X–1, X+1. Although page X+1 had not yet been written, the page X+1 is still considered as preceding page X.

A third rule for other blocks in the R-block where page X is not detected as erased (e.g., die 0, block 122a, page X 126) is that (i) page X is also unreliable and (ii) D word lines before page X are unreliable. The value of D is chosen to be the same as in the second rule. The third rule accounts for pages in the R-block programmed in parallel. In some embodiments, the page X–1 is treated as unreliable in blocks subsequent to the block containing page X in the R-block order. In other embodiments, page X is treated as unreliable in blocks prior to the block containing page X in the R-block order, because page X and subsequent pages are all determined to be erased.

Any pages that are in word lines preceding the unsafe zone are considered reliable and they form a safe zone. No data hardening is applied to the data stored in the safe zone.

The circuit 100 subsequently determines "no write" pages in the step 152 and does not write to such no-write pages. In the step 154, the circuit 100 determines the boundaries of the pad zone. The recovery continues with writing in the R-block 120 rather than erasing the R-block 120 and/or writing new data in a new R-block. Random nonuser data is written by the circuit 100 to a number of pages, called the pad zone, in the step 156. Writing the random data is based on the following considerations. The first erased page (e.g., lower page X 124) is not a fully accurate location where the power failure happened so writing user data immediately on or after the first erased page may not be reliable. Nonvolatile memory typically obtains a best reliability when random data is written to the entire block. Partially written blocks may be more vulnerable to read disturb effects. A pad zone filled with nonuser data also helps handle repeated power failures (e.g., a power failure during recovery). With multi-level cell type memory, filling the pad zone ensures that any upper pages to be programmed with user data have a reliable lower page.

In some embodiments, the random data in the pad zone is error correction code protected (as with the user data) so that the random data may later be corrected and used as an aid in recovering other data. For example, knowing the correct value of a lower-page may help recover the corresponding upper page. The pad zone may have some overlap with the unsafe zone. The principle of choosing and writing to the pad zone is to write all erased pages starting from page X, until D word lines after the word line that contains page X.

An exception in writing to pages in the pad zone is that some upper pages should not be written to avoid possible lower page corruption on the lower pages that may contain otherwise recoverable data. Such are called "no-write" pages (e.g., page X+1 128 and page X+3 130). The "no write" pages are identified in the step 152 as some pages following page X, but the corresponding lower pages are not erased.

The ready-for-program zone includes all the remaining word lines in the R-block where new use data can be programmed. In the example shown in FIG. 2, the ready-for-program zone starts at page X+8 132 and continues through the last page 255 in the blocks 122a-122n.

Once all of the empty pages in the pad zone have been filled, except the no-write pages, the circuit 100 continues with any other steps normally performed in recovering from the power failure in the step 158. At some point during the normal recovery steps, the circuit 100 recycles all (or at least a portion of) the correctable data in the unsafe zone per the step 160.

Advantages of the data recovery method generally include, but are not limited to, the following. The method 140 can reliably handle a power failure in the circuit 102 with multi-level cells/triple-level cells even without an external capacitor. Therefore, product cost is lowered. Entire blocks/R-block are not erased, which reduces wear and write-amplification. The method 140 can also handle the rare case of another power failure during a programming operation in the recovery procedure. If the next power failure happens during any of the steps 144-160, the method 140 is restarted. Any random data written during the step 156 is scanned and treated similar to other data in the R-block during the next recovery.

Figure 4:
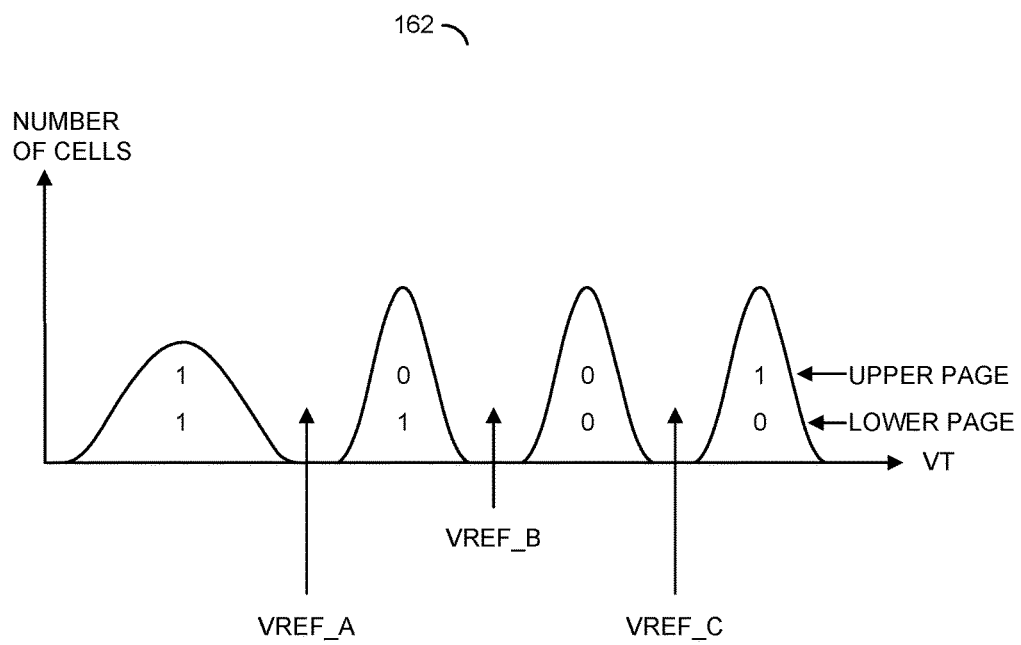
FIG. 4 is a graph of example multi-level cell threshold voltage distributions.

Referring to FIG. 4, a graph of example multi-level cell threshold voltage distributions 162 is shown. In the multi-level cell type device, each memory cell generally stores multiple (e.g., 2) bits and utilizes more than 2 (e.g., 4) threshold voltage (e.g., Vt) levels. In some nonvolatile memories, gray mapping is used to map the bit values to the threshold voltage levels. The multiple bits in each memory cell generally reside in multiple (e.g., 2) pages: the lower page and the upper page.

To read the lower page, a center reference voltage (e.g., voltage VREF_B) is used. Cells below the center reference voltage VREF_B are sensed as logical ones. Cells above the center reference voltage VREF_B are sensed as logical zeros.

To read the upper page, the upper reference voltage (e.g., VREF_C) and the lower reference voltage (e.g., VREF_A) are applied to the cells. Cells lower than the lower reference voltage VREF_A are sensed as logical ones. Cells between the lower and center reference voltages VREF_A and VREF_B are sensed as logical zeros. Cells between the center and upper reference voltages VREF_B and VREF_C are sensed as logical zeros. Cells above the upper reference voltage VREF_C are sensed as logical ones.

Figure 5:
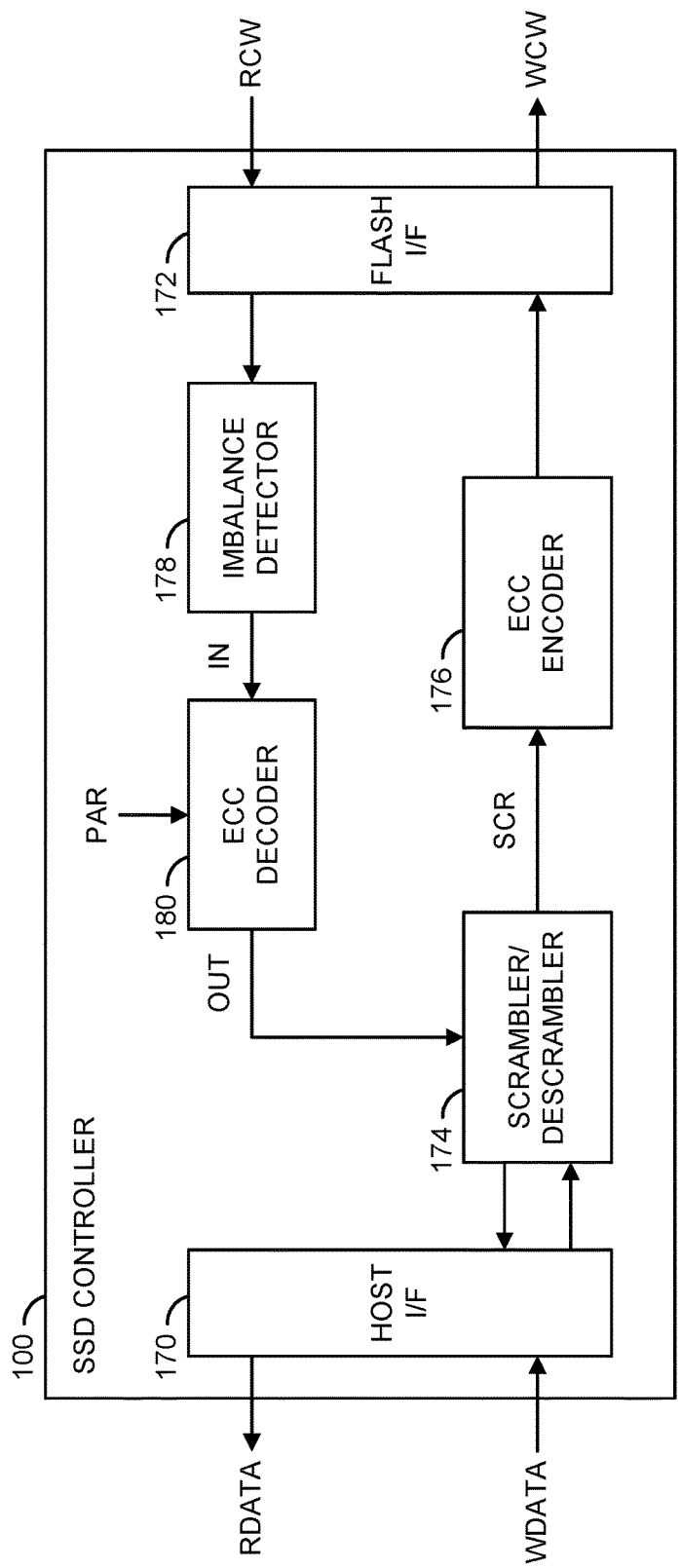
FIG. 5 is a block diagram of an implementation of a controller in the apparatus.

Referring to FIG. 5, a block diagram of an example implementation of the circuit 100 is shown. The circuit 100 generally comprises a block (or circuit) 170, a block (or circuit) 172, a block (or circuit) 174, a block (or circuit) 176, a block (or circuit) 178 and a block (or circuit) 180. The circuits 170 to 180 may represent modules and/or blocks that may be implemented as hardware, software, a combination of hardware and software, or other implementations.

The circuit 174 is shown receiving the signal WDATA through the circuit 170. The signal RDATA is generated and presented by the circuit 174 to the circuit 92 through the circuit 170. The signal (e.g., SCR) is generated and presented by the circuit 174. The circuit 176 is shown receiving the signal SCR. The signal SCR generally carries scrambled data. The signal WCW is generated by the circuit 176 and presented to the circuit 94 through the circuit 172. The circuit 178 is shown receiving the signal RCW via the circuit 172. A signal (e.g., IN) is generated by the circuit 178 and transferred to the circuit 180. The signal IN carries the scrambled (raw) error correction coded data read from the circuit 94. The circuit 180 is shown generating a signal (e.g., OUT) received by the circuit 174. The signal OUT carries corrected data generated by an error correction of the scrambled data of the signal IN. A signal (e.g., PAR) is shown being received by the circuit 180. The signal PAR conveys parameters used during a decoding of the codewords, such as parameters stored in the circuit 94 and/or provided by a processor of circuit 100 (not shown).

The circuit 170 is shown implemented as a host interface circuit. The circuit 170 is operational to provide communication with the circuit 92 via the signals WDATA and RDATA. Other signals may be implemented between the circuits 92 and 170 to meet the criteria of a particular application.

The circuit 172 is shown implemented as a nonvolatile memory (e.g., Flash) interface circuit. The circuit 172 is operational to provide communication with the circuit 94 via the signals WCW and RCW. Other signals may be implemented between the circuits 94 and 172 to meet the criteria of a particular application.

The circuit 174 implements a scrambler/descrambler circuit. The circuit 174 generally operates on (scrambles) the write data received in the signal WDATA to generate scrambled write data in the signal SCR. The data is scrambled in a reversible manner such that the scrambled data has a known statistical distribution of storage states. An example of a block comprising scrambled data is a block containing similar numbers of zero bits and one bit values and a 4-level multi-level cell block comprising scrambled data containing similar numbers of "00", "01", "10", and "11" states. In some embodiments, circuit 174 also performs an encryption (e.g., an Advanced Encryption Standard cipher) that randomizes the data as a by-product of the encryption. In some embodiments, circuit 174 includes a linear feedback shift register configured to randomize the data.

The circuit 174 is also operational to descramble the error corrected read data received in the signal OUT. The descrambling generally reverses the scrambling performed on the write data. The descrambled data is presented in the signal RDATA. The circuit 174 also includes a decryption capability to reverse any encryption performed on the write data.

The circuit 176 implements an error correction code encoder circuit. The circuit 176 is generally operational to error correction encode the scrambled data received in the signal SCR using an error correction encoding technique. The error correction coded and scrambled data is presented in the signal WCW to the circuit 94.

The circuit 178 implements an imbalance detector circuit. The circuit 178 is generally operational to monitor the read data received from the circuit 94 and at least temporarily maintains data on the statistical distributions of states. The statistical distributions may be used in determining if a page is programmed or not.

The circuit 180 generally implements an error correction code decoder circuit. The circuit 180 is operational to process the read data units received in the signal IN. The processing generally exploits the included additional error correction coded bits to correct any errors that may have arisen at any point and time since the data was initially encoded. The resulting error corrected data is presented in the signal OUT to the circuit 174.

Figure 6:
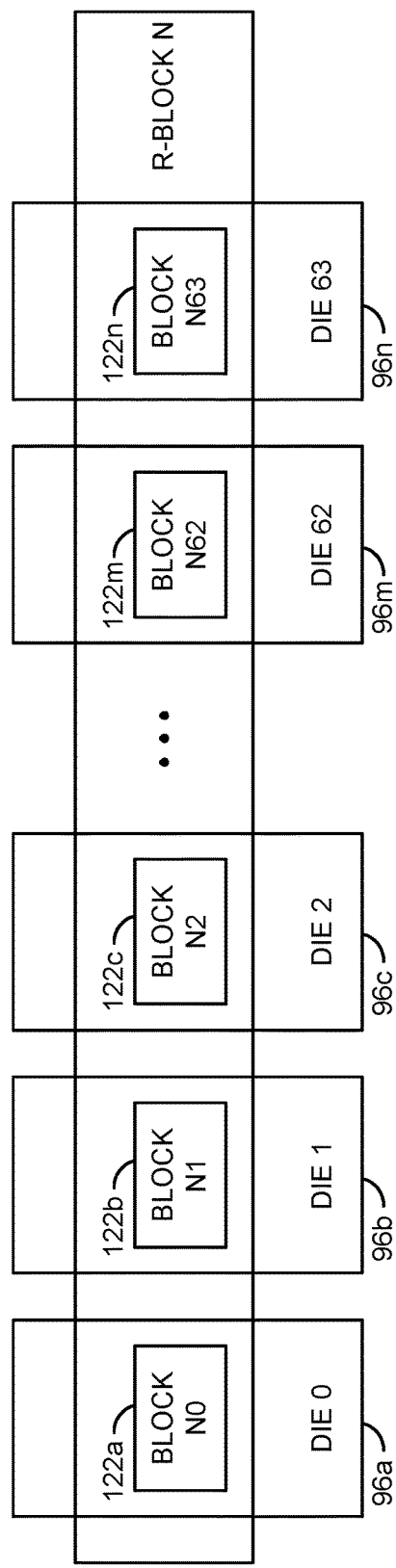
FIG. 6 is a block diagram of an example R-block N.

Referring to FIG. 6, a block diagram of an example R-block N is shown. The R-block N generally comprises the blocks (or units) 122*a*-122*n* (e.g., N0-N63). Each block 122*a*-122*n* is generally fabricated on a different die 96*a*-96*n* (e.g., Die 0-Die 63) in the circuit 94. In some situations, the R-block N may have a fewer number of blocks 122*a*-122*n* than the number of dies 96*a*-96*n*. In other situations, the R-block N may have a larger number of blocks 122*a*-122*n* than the number of dies 96*a*-96*n*.

By using the R-block as the allocated granularity, the circuit 100 provides a fault tolerant capability that allows for the loss of one or more blocks 122*a*-122*n* (or the corresponding die 96*a*-96*n*). The circuit 100 is operational to generate redundant information (e.g., parity information) as at least a portion of the data being stored in the R-block N. The redundant information generally allows reconstruction of the data in the event that one or more of the blocks 122*a*-122*n* fails and/or loses power. The data reconstruction may be similar to the reconstruction in a redundant array of independent disk (e.g., RAID) hard disk drive. The redundant information is stored in one or more of the blocks 122*a*-122*n* of the R-block N. The fault tolerance of the redundant information may be adjustable. For example, a single redundant block (e.g., 122*a*) may be used to store redundant information sufficient to recover from the loss of a single block 122*b*-122*n*. Two redundant blocks (e.g., 122*a*-122*b*) may be used to recover from the loss of two blocks 122*c*-122*n*. Where the redundant information is a mirror copy of the data (e.g., RAID 1), half the blocks 122*a*-122*n* may store the data and the other half stores the mirrored copy of the data. The redundant data can be used by the circuit 100 when recovering pages containing possible partially written data.

Figure 7:
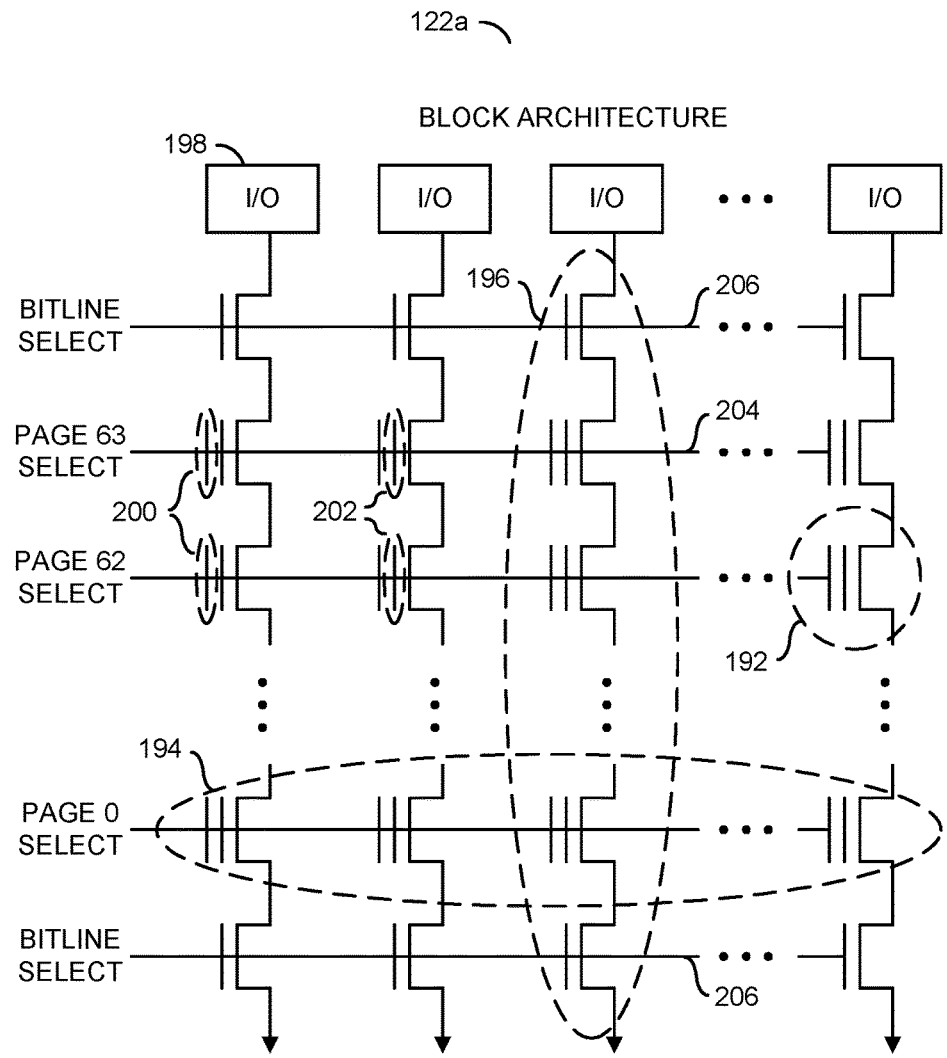
FIG. 7 is a diagram illustrating an example block architecture of a NAND Flash based nonvolatile memory device.

Referring to FIG. 7, a diagram illustrating an example block architecture of a NAND Flash based nonvolatile memory device is shown. Nonvolatile memory cells are organized into a hierarchy of bytes, pages, blocks and planes. For example, in a block 122*a*, memory cells 192 are arranged in a number of pages 194. In a typical 4 gigabit (Gb) single-level cell nonvolatile device, the block 122*a* may comprise 64 pages 194, and each page 194 may comprise 16,896 bits, each bit being implemented as a memory cell 192. Other numbers of pages and cells may be implemented to meet the criteria of a particular application.

The memory chips arrange the memory cells 192 in a logical "not-AND" (NAND) configuration. The NAND configuration forms a string 196 from all the memory cells 192 for a common input/output (I/O) bit line 198 across all of the memory pages 194. The NAND configuration does not allow individual data bytes within a memory page 194 to be directly accessed. A read operation performed by the circuit 100 reads an entire memory page 194 from the nonvolatile device. Also, an entire memory page 194 is generally programmed at the same time. Each memory cell 192 comprises a control gate 200 and a floating gate 202. The control gates 200 for a page 194 are connected to a page select line (or word line) 204. To access a page 194 of the block 122*a*, bit line select lines (or bit line/ground select lines) 206 are asserted connecting the strings 196 between ground and the input/output bit lines 198.

Erasing the contents of a memory cell 192 is performed by placing a high voltage on a silicon substrate while holding the control gate 200 at zero volts. The electrons stored on the floating gate 202 tunnel through an oxide barrier into the positive substrate. Thousands of memory cells 192 are etched onto a common section of the substrate, forming the single block 122*a* of memory. All memory cells 192 in the block 122*a* are simultaneously erased when the substrate is "flashed" to a positive voltage. Thus, erase operations are in block units.

The memory cells 192 are programmed by placing a high voltage on the control gates 200 while holding source and drain regions at zero volts. The high electric field causes an N-channel to form and allows electrons to tunnel through the oxide barrier into the floating gates 202. Programming the memory cells 192 is performed one word at a time and usually an entire page is programmed in a single operation.

The functions performed by the diagrams of FIGS. 1-7 may be implemented using one or more of a conventional general purpose processor, digital computer, microprocessor, microcontroller, RISC (reduced instruction set computer) processor, CISC (complex instruction set computer) processor, SIMD (single instruction multiple data) processor, signal processor, central processing unit (CPU), arithmetic logic unit (ALU), video digital signal processor (VDSP) and/or similar computational machines, programmed according to the teachings of the specification, as will be apparent to those skilled in the relevant art(s). Appropriate software, firmware, coding, routines, instructions, opcodes, microcode, and/or program modules may readily be prepared by skilled programmers based on the teachings of the disclosure, as will also be apparent to those skilled in the relevant art(s). The software is generally executed from a medium or several media by one or more of the processors of the machine implementation.

The invention may also be implemented by the preparation of ASICs (application specific integrated circuits), Platform ASICs, FPGAs (field programmable gate arrays), PLDs (programmable logic devices), CPLDs (complex programmable logic devices), sea-of-gates, RFICs (radio frequency integrated circuits), ASSPs (application specific standard products), one or more monolithic integrated circuits, one or more chips or die arranged as flip-chip modules and/or multi-chip modules or by interconnecting an appropriate network of conventional component circuits, as is described herein, modifications of which will be readily apparent to those skilled in the art(s).

The invention thus may also include a computer product which may be a storage medium or media and/or a transmission medium or media including instructions which may be used to program a machine to perform one or more processes or methods in accordance with the invention. Execution of instructions contained in the computer product by the machine, along with operations of surrounding circuitry, may transform input data into one or more files on the storage medium and/or one or more output signals representative of a physical object or substance, such as an audio and/or visual depiction. The storage medium may include, but is not limited to, any type of disk including floppy disk, hard drive, magnetic disk, optical disk, CD-ROM, DVD and magneto-optical disks and circuits such as ROMs (read-only memories), RAMs (random access memories), EPROMs (erasable programmable ROMs), EEPROMs (electrically erasable programmable ROMs), UVPROM (ultra-violet erasable programmable ROMs), Flash memory, magnetic cards, optical cards, and/or any type of media suitable for storing electronic instructions.

The elements of the invention may form part or all of one or more devices, units, components, systems, machines and/or apparatuses. The devices may include, but are not limited to, servers, workstations, storage array controllers, storage systems, personal computers, laptop computers, notebook computers, palm computers, personal digital assistants, portable electronic devices, battery powered devices, set-top boxes, encoders, decoders, transcoders, compressors, decompressors, pre-processors, post-processors, transmitters, receivers, transceivers, cipher circuits, cellular telephones, digital cameras, positioning and/or navigation systems, medical equipment, heads-up displays, wireless devices, audio recording, audio storage and/or audio playback devices, video recording, video storage and/or video playback devices, game platforms, peripherals and/or multi-chip modules. Those skilled in the relevant art(s) would understand that the elements of the invention may be implemented in other types of devices to meet the criteria of a particular application.

The terms "may" and "generally" when used herein in conjunction with "is(are)" and verbs are meant to communicate the intention that the description is exemplary and believed to be broad enough to encompass both the specific examples presented in the disclosure as well as alternative examples that could be derived based on the disclosure. The terms "may" and "generally" as used herein should not be construed to necessarily imply the desirability or possibility of omitting a corresponding element.

While the invention has been particularly shown and described with reference to embodiments thereof, it will be understood by those skilled in the art that various changes in form and details may be made without departing from the scope of the invention.

The invention claimed is:

1. A method for recovery after a power failure, comprising the steps of:
    searching at least some of a plurality of pages of a memory to find a first erased page in response to an unsafe power down;
    moving stored data located between a particular word line in the memory that contains the first erased page and a previous word line that is at least two word lines before the particular word line; and
    writing new data starting in a subsequent word line that is at least two word lines after the particular word line that contains the first erased page.

2. The method according to claim 1, wherein the stored data is moved by:
    reading the stored data;
    generating corrected data by correcting the stored data; and
    writing the corrected data in the memory at or beyond the subsequent word line.

3. The method according to claim 1, further comprising the step of:
    writing random data between the particular word line and the subsequent word line.

4. The method according to claim 3, wherein each upper page between the particular word line and the subsequent word line that has a corresponding lower page that is programmed is bypassed when the random data is written.

5. The method according to claim 1, further comprising the step of:
    restoring a map of the memory using data located prior to the previous word line.

6. The method according to claim 1, further comprising the step of:
    leaving one or more of the plurality of pages between the particular word line and the subsequent word line in an erased state.

7. The method according to claim 1, wherein the new data is written in a same block of the memory that contains the first erased page.

8. The method according to claim 1, wherein the plurality of pages are searched starting in a block of the memory last written in before the unsafe power down.

9. The method according to claim 1, wherein the steps are performed in a solid-state drive.

10. An apparatus comprising:
    a memory configured to store data; and
    a controller configured to
        process a plurality of input/output requests to read/write to/from the memory,
        search at least some of a plurality of pages of the memory to find a first erased page in response to an unsafe power down,
        move stored data located between a particular word line in the memory that contains the first erased page and a previous word line that is at least two word lines before the particular word line, and
        write new data starting in a subsequent word line that is at least two word lines after the particular word line that contains the first erased page.

11. The apparatus according to claim 10, wherein the controller moves the stored data by
    reading the stored data,
    generating corrected data by correcting the stored data, and
    writing the corrected data in the memory at or beyond the subsequent word line.

12. The apparatus according to claim 10, wherein the controller is further configured to
    write random data between the particular word line and the subsequent word line.

13. The apparatus according to claim 12, wherein each upper page between the particular word line and the subsequent word line that has a corresponding lower page that is programmed is bypassed when the random data is written.

14. The apparatus according to claim 10, wherein the controller is further configured to
    restore a map of the memory using data located prior to the previous word line.

15. The apparatus according to claim 10, wherein the controller is further configured to
    leave one or more of the plurality of pages between the particular word line and the subsequent word line in an erased state.

16. The apparatus according to claim 10, wherein the controller is further configured to
write the new data in a same block of the memory that contains the first erased page.

17. The apparatus according to claim 10, wherein the controller is further configured to
search the plurality of pages starting in a block of the memory last written in before the unsafe power down.

18. The apparatus according to claim 10, wherein the memory and the controller are part of a solid-state drive.

19. An apparatus comprising:
an interface configured to process a plurality of read/write operations to/from a memory; and
a control circuit configured to
search at least some of a plurality of pages of the memory to find a first erased page in response to an unsafe power down,
move stored data located between a particular word line in the memory that contains the first erased page and a previous word line that is at least two word lines before the particular word line, and
write new data starting in a subsequent word line that is at least two word lines after the particular word line that contains the first erased page.

20. The apparatus according to claim 19, wherein the interface and the control circuit are part of a solid-state drive.

\* \* \* \* \*